(12) United States Patent
Hou et al.

(10) Patent No.: US 9,553,170 B2
(45) Date of Patent: Jan. 24, 2017

(54) MANUFACTURING METHOD OF THIN FILM TRANSISTOR AND THIN FILM TRANSISTOR

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xuecheng Hou, Beijing (CN); Tao Wu, Beijing (CN); Jian Guo, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/425,994

(22) PCT Filed: Jun. 26, 2014

(86) PCT No.: PCT/CN2014/080813
§ 371 (c)(1),
(2) Date: Mar. 4, 2015

(87) PCT Pub. No.: WO2015/113368
PCT Pub. Date: Aug. 6, 2015

(65) Prior Publication Data
US 2016/0013294 A1    Jan. 14, 2016

(30) Foreign Application Priority Data

Jan. 28, 2014 (CN) .......................... 2014 1 0042408

(51) Int. Cl.
*H01L 29/786* (2006.01)
*H01L 21/308* (2006.01)
(Continued)

(52) U.S. Cl.
CPC ..... *H01L 29/66765* (2013.01); *H01L 21/3081* (2013.01); *H01L 21/3083* (2013.01);
(Continued)

(58) Field of Classification Search
CPC .................................................. H01L 27/1288
See application file for complete search history.

(56) References Cited

U.S. PATENT DOCUMENTS 5,612,235 A    3/1997  Wu et al.
6,063,653 A *  5/2000  Lin ................... H01L 29/66765
                                                257/E21.414
(Continued)

FOREIGN PATENT DOCUMENTS

CN          1619703 A    5/2005
CN        101266951 A    9/2008
(Continued)

OTHER PUBLICATIONS

International Search Report and Written Opinion of the International Searching Authority with Notice of Transmittal of the International Search Report and Written Opinion of PCT/CN2014/080813 in Chinese, mailed Oct. 31, 2014.
(Continued)

*Primary Examiner* — Eric Ward
(74) *Attorney, Agent, or Firm* — Collard & Roe, P.C.

(57) ABSTRACT

A manufacturing method of a thin film transistor and a thin film transistor are provided. In the manufacturing method, formation of pattern of a source electrode (7), a drain electrode (8) and an active layer (6) comprises: forming a semiconductor layer (10) and a conductive layer (11) that cover the whole substrate on the substrate in sequence; forming a first photoresist layer (4) at a region where the source electrode is to be formed and at a region where the drain electrode is to be formed on the conductive layer (11),
(Continued)

respectively; forming a second photoresist layer (5) at least at a gap between the source electrode and the drain electrode that are to be formed on the conductive layer (11); conducting an etching process on the substrate with the first photoresist layer (4), the second photoresist layer (5), the semiconductor layer (10) and the conductive layer (11) formed thereon, so as to form pattern of the active layer (6), the source electrode (7) and the drain electrode (8).

19 Claims, 4 Drawing Sheets

(51) Int. Cl.
 H01L 21/3213 (2006.01)
 H01L 29/66 (2006.01)
 H01L 27/12 (2006.01)
 H01L 29/417 (2006.01)
(52) U.S. Cl.
 CPC .... H01L 21/32139 (2013.01); H01L 27/1288 (2013.01); H01L 29/41733 (2013.01); H01L 29/66969 (2013.01); H01L 29/7869 (2013.01); H01L 29/78669 (2013.01); H01L 29/78678 (2013.01)

(56) References Cited

U.S. PATENT DOCUMENTS

| | | | | |
|---|---|---|---|---|
| 6,380,006 B2* | 4/2002 | Kido | ................. | G03F 7/40 |
| | | | | 257/E21.314 |
| 6,635,581 B2* | 10/2003 | Wong | ................. | H01L 29/66765 |
| | | | | 257/E21.414 |
| 6,767,694 B2* | 7/2004 | Kido | ................. | G02F 1/13458 |
| | | | | 257/E21.027 |
| 7,795,081 B2* | 9/2010 | Liu | ................. | H01L 27/1214 |
| | | | | 257/E21.028 |
| 7,858,415 B2* | 12/2010 | Saito | ................. | H01L 27/1285 |
| | | | | 257/E21.414 |
| 8,158,466 B2 | 4/2012 | Kim et al. | | |
| 2004/0131976 A1* | 7/2004 | Hsu | ................. | H01L 29/66765 |
| | | | | 430/311 |
| 2010/0170871 A1 | 7/2010 | Sone et al. | | |
| 2011/0079853 A1 | 4/2011 | Nam et al. | | |
| 2012/0129284 A1* | 5/2012 | He | ................. | H01L 27/1288 |
| | | | | 438/30 |
| 2014/0077207 A1 | 3/2014 | Gao et al. | | |

FOREIGN PATENT DOCUMENTS

| | | |
|---|---|---|
| CN | 101354535 A | 1/2009 |
| CN | 101908537 A | 12/2010 |
| CN | 102768990 A | 11/2012 |
| CN | 102890378 A | 1/2013 |
| CN | 103107133 A | 5/2013 |
| CN | 103500764 A | 1/2014 |
| CN | 103779232 A | 5/2014 |
| KR | 10-2007-0027874 A | 3/2007 |

OTHER PUBLICATIONS

Chinese Office Action of Chinese Application No. 201410042408.5, mailed Nov. 30, 2015 with English translation.
Second Chinese Office Action in Chinese Application No. 201410042408.5, mailed May 3, 2016 with English translation.
English translation of the International Preliminary Report on Patentability and Written Opinion of the International Searching Authority of PCT/CN2014/080813, issued Aug. 2, 2016.

* cited by examiner

MANUFACTURING METHOD OF THIN FILM TRANSISTOR AND THIN FILM TRANSISTOR

CROSS REFERENCE TO RELATED APPLICATIONS

This application is the National Stage of PCT/CN2014/080813 filed on Jun. 26, 2014, which claims priority under 35 U.S.C. §119 of Chinese Application No. 201410042408.5 filed on Jan. 28, 2014, the disclosure of which is incorporated by reference.

TECHNICAL FIELD

Embodiments of the present invention relate to a manufacturing method of a thin film transistor and a thin film transistor.

BACKGROUND

Thin Film Transistors functioning as switching devices play an important role in the field of display technology.

In general, a thin film transistor comprises at least a gate electrode, a source electrode and a drain electrode (or source-drain electrodes), a channel layer (also called as an active layer) and so on. In recent years, in order to simplify the process flow or reduce the used number of masks, patterns of an active layer, a source electrode and a drain electrode and so on are produced in such a way that a semiconductor layer for manufacture of pattern of the active layer and a conductive layer for manufacture of pattern of the source electrode and the drain electrode are deposited firstly, next, a photoresist pattern with different thicknesses is formed by using a gray tone mask (GTM) or half tone mask (HTM) technology, and finally, an etching process is carried out to produce the patterns of the active layer, a source electrode and a drain electrode, and so on.

With a bottom-gate type TFT as an example, a method for manufacturing the TFT comprises the following steps:

(1) a gate electrode and a gate insulating layer are produced on a substrate;
(2) a semiconductor layer and a conductive layer are deposited on the substrate with the gate electrode and the gate insulating layer formed thereon in sequence;
(3) a photoresist pattern is formed on the conductive layer with a gray-tone mask or a half-tone mask, the gray-tone mask or the half-tone mask being used for realization of a photoresist layer with different thicknesses, so that a thickness of a photoresist at a region of the conductive layer where source and drain electrodes are to be formed and a thickness of the photoresist at a region between the source electrode and the drain electrode are unequal;
(4) etching processes are conducted on the conductive layer and the semiconductor layer successively, so as to form pattern of an active layer, the source electrode and the drain electrode.

SUMMARY

According to at least one embodiment of the present invention, there is provided a manufacturing method of a thin film transistor, with which, the thin film transistor possessing a higher yield can be produced.

The manufacturing method of the thin film transistor according to at least one embodiment of the invention comprises forming a gate electrode pattern and a gate insulating layer on a substrate, and forming patterns of a source electrode, a drain electrode and an active layer. Forming patterns of the source electrode, the drain electrode and the active layer comprises forming a semiconductor layer and a conductive layer that cover the whole substrate in sequence on the substrate; forming a first photoresist layer at a region where the source electrode is to be formed and at a region where the drain electrode is to be formed on the conductive layer, respectively; forming a second photoresist layer at least at a gap to be formed between the source electrode and the drain electrode on the conductive layer, conducting an etching process on the substrate with the first photoresist layer, the second photoresist layer, the semiconductor layer and the conductive layer formed thereon so as to form patterns of the active layer, the source electrode and the drain electrode.

According to at least one embodiment of the present invention, there is further provided a thin film transistor, which is produced by using the above manufacturing method of the thin film transistor.

DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

In recent years, with gradual decrease of the graphical line width, the distance between a source electrode and a drain electrode becomes smaller and smaller, and it is usually on the order of several micrometers. It is very easy for the source electrode and the drain electrode to be shorted due to incomplete etching (namely, a GT bridge defect is formed). Additionally, an active layer may also be damaged due to excessive etching, resulting in disconnection of the active layer (namely, a channel open defect is formed). A photoresist layer that has different thicknesses in different regions is formed through a gray tone mask or a half tone mask. Because of restriction on the homogeneity of resist coating and the homogeneity of exposure, the homogeneity of thickness of a photoresist layer that is produced corresponding to an incomplete exposure area (i.e., a region corresponding to a channel) is difficult to be accurately controlled. Thus, some regions are thinner, and some regions are thicker. The subsequent etching is conducted on the condition of equal thickness, and this results in the fact that the photoresist in a thicker region is etched incompletely so that a source-drain shorted (GT Bridge) defect is generated, and the photoresist in a thinner region is excessively etched so that a channel open defect occurs to the TFT when it is powered, and the working performance of the TFT is seriously affected, or this causes fault of the TFT, and so the yield of TFTs produced in mass production is degraded.

According to at least one embodiment of the invention, there are provided a manufacturing method of a thin film transistor and a thin film transistor, in which two layers of photoresist are produced respectively on a film layer for forming the patterns of a source electrode, a drain electrode and an active layer through two patterning processes. The first layer of photoresist acts to make the photoresist merely cover regions where the source electrode and the drain electrode to be formed are located, and a region corresponding to a gap between the source electrode and the drain electrode to be formed is exposed; and the second layer of photoresist acts to make the photoresist cover the region corresponding to the gap between the source electrode and the drain electrode to be formed. The thickness of the second layer of photoresist provided in the region corresponding to the gap between the source electrode and the drain electrode is uniform. The subsequent etching is conducted on the condition of equal thickness, and due to uniform thickness of the second layer of photoresist, a source-drain shorted (GT Bridge) defect will not be generated, or such an issue of a channel open defect upon electrification of the TFT will not arise. So the yield of TFTs produced in mass production is raised.

It is to be noted that, the active layer of TFT is located below the source electrode and the drain electrode, a part of the active layer corresponding to the gap between the source electrode and the drain electrode works as a channel region of the TFT when the TFT is turned on, the length of the channel is approximately equal to width of the gap between the source electrode and the drain electrode, and the width of the channel is approximately equal to length of the gap between the source electrode and the drain electrode.

According to at least one embodiment of the invention, there is provided a manufacturing method of a thin film transistor, including forming a gate electrode pattern and a gate insulating layer on a substrate, and forming patterns of a source electrode, a drain electrode and an active layer.

It is to be noted that, there is no limit on the material for the active layer in the TFT provided by the invention, for example, which may be an amorphous silicon layer, a polycrystalline silicon layer or a metal oxide semiconductor layer; and there is no limit on the structure of the TFT, which may be of a bottom-gate type, and may also be of a top-gate type.

Hereinafter, the process for producing patterns of the source electrode, the drain electrode and the active layer according to an embodiment of the invention will be specifically described.

Figure 1:
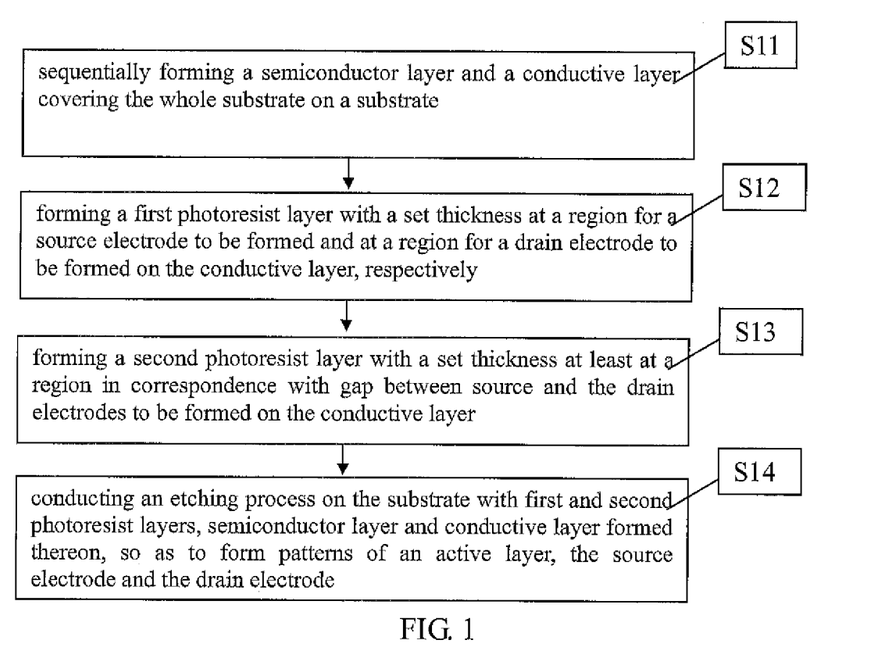
FIG. 1 is a schematically flowchart illustrating manufacture of a TFT provided by an embodiment of the invention.

Referring to FIG. 1, manufacturing patterns of the source electrode, the drain electrode and the active layer comprises the following steps.

S11, a semiconductor layer and a conductive layer that cover the whole substrate are sequentially formed on the substrate;

S12, a first photoresist layer in a set thickness is formed respectively at a region where the source electrode is to be formed and at a region where the drain electrode is to be formed on the conductive layer;

S13, a second photoresist layer with a set thickness is formed at least at a region corresponding to a gap between the source electrode and the drain electrode to be formed on the conductive layer;

S14, an etching process is conducted on the substrate with the first photoresist layer, the second photoresist layer, the semiconductor layer and the conductive layer formed thereon, so as to form patterns of the active layer, the source electrode and the drain electrode.

In at least one embodiment of the invention, at the same time that the second photoresist layer is formed, it further comprises forming the second photoresist layer located on the first photoresist layer.

The patterning process mentioned in at least one embodiment of the invention at least comprises coating or dripping of photoresist, exposure, development, lithographical etching and the like step.

Hereinafter, with a bottom-gate TFT as an example, the manufacturing method of a thin film transistor provided by at least one embodiment of the invention will be specifically described.

Step 1, a gate electrode and a gate insulating layer are produced.

Figure 2:
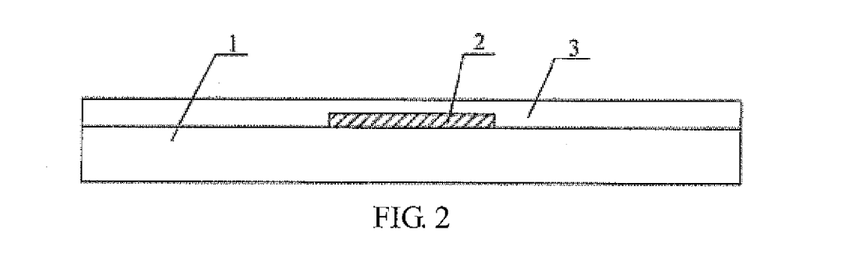
FIG. 2 is a structurally schematic view illustrating a TFT including a gate electrode and a gate insulating layer provided by an embodiment of the invention.

Referring to FIG. 2, a conductive layer is deposited on a substrate 1, and subjected to a patterning process, so as to form pattern of a gate electrode 2. In this step, a first mask is used for manufacture of the gate electrode pattern, and the material for the gate electrode is not limited.

Referring to FIG. 2, a single-layer or multilayered insulating layer is formed on the substrate 1 with the gate electrode 2 formed thereon to function as a gate insulating layer. Method for forming the gate insulating layer is not limited, and the material for the gate insulating layer is not limited.

With respect to a bottom-gate TFT, before patterns of the source electrode, the drain electrode and the active layer are formed, a gate electrode pattern and a gate insulating layer located on the gate electrode pattern are formed on the substrate.

With respect to a top-gate TFT, after patterns of the source electrode, the drain electrode and the active layer is formed, a gate insulating layer and a gate electrode pattern located on the gate insulating layer are formed on the substrate.

Step 2, patterns of the source electrode, the drain electrode and the active layer are produced.

The process for producing patterns of the source electrode, the drain electrode and the active layer shown in FIG. 1 will be concretely described in conjunction with description of step 1.

Step S11, a semiconductor layer and a conductive layer that cover the whole substrate are sequentially formed on a substrate.

Figure 3:
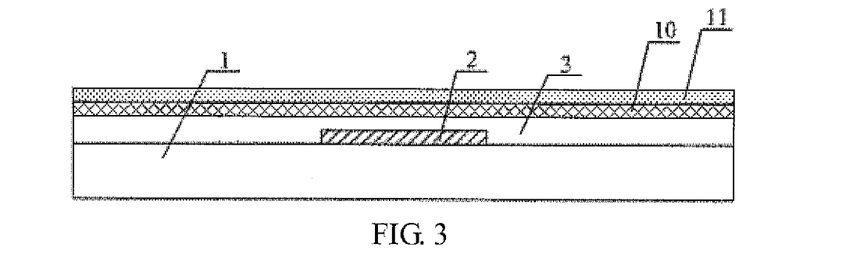
FIG. 3 is a structurally schematic view illustrating a TFT including a semiconductor layer used for forming an active layer and a conductive layer used for forming a source electrode and a drain electrode provided by an embodiment of the invention.

On the substrate with the gate electrode and the gate insulating layer formed thereon, a semiconductor layer 10 covering the whole substrate may be deposited by using a chemical vapor deposition method, a thermal evaporation method or the like. The semiconductor layer may be a film layer of amorphous silicon, polycrystalline silicon, metal oxide semiconductor or the like, and is used for production of an active layer pattern.

On the substrate with the semiconductor layer 10 formed thereon, a conductive layer 11 covering the whole substrate may be deposited by using a chemical vapor deposition method, a thermal evaporation method or the like, and the conductive layer 11 is used for production of pattern of the source electrode and the drain electrode.

The formed structure is shown in FIG. 3, and a TFT comprises the semiconductor layer 10 located on the gate insulating layer 3 and the conductive layer 11 located on the semiconductor layer 10.

Step S12, a first photoresist layer with a set thickness is formed respectively at a region where the source electrode is to be formed and at a region where the drain electrode is to be formed on the conductive layer.

Figure 4:
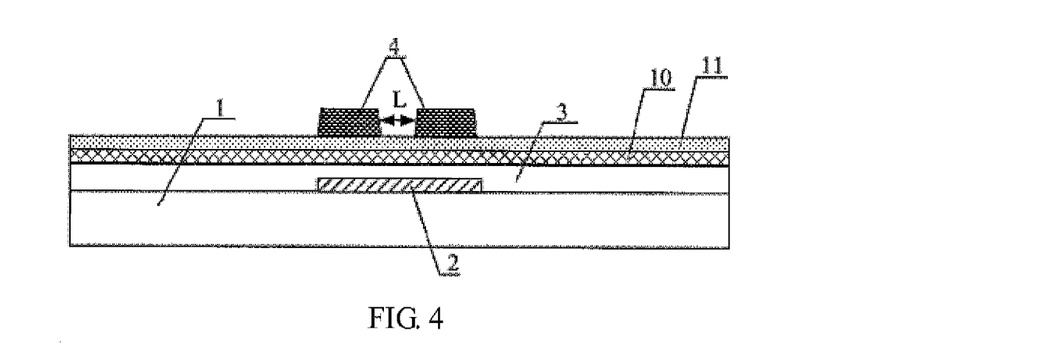
FIG. 4 is a structurally schematic view illustrating a TFT including a first photoresist layer provided by an embodiment of the invention.

On the substrate 1 with the semiconductor layer 10 and the conductive layer 11 formed thereon, a photoresist (PR) layer with a set thickness is formed, and at this time, the photoresist layer covers the whole conductive layer for forming the source electrode and the drain electrode. Exposure and development are conducted on the photoresist layer through a second mask, so as to retain the photoresist directly on the region where the source electrode and the drain electrode are to be formed, and fully remove the photoresist at other location(s). The photoresist over the source electrode to be formed together with the photoresist over the drain electrode to be formed serves as a first photoresist layer. As shown in FIG. 4, it comprises a first photoresist layer 4 located directly on the source electrode and the drain electrode to be formed.

The photoresist used herein may be positive type photoresist, and may also be negative type photoresist.

Description will be given below with reference to an example in which the photoresist is positive type photoresist. Regions other than the regions corresponding to the source electrode and the drain electrode are fully exposed through a second mask, and the photoresist at the exposed region is fully removed such as by a developer so as to realize the development. Of course, the photoresist at a region corresponding to a gap between the source electrode and the drain electrode is fully exposed, and fully removed off upon development, so as to expose the conductive layer 11.

Forming the photoresist on the conductive layer 11 may be carried out by way of coating, dripping, spinning, or the like, and the concrete implementation method may be determined according to actual requirements, no limit being set here.

The thickness of the first photoresist layer 4 is not limited. For example, the thickness of the first photoresist layer 4 is approximately in the range of 1.5 µm to 2.5 µm (in correspondence with 15000 Å to 25000 Å).

For example, the first photoresist layer 4 shown in FIG. 4 is a hydrophobic photoresist layer. Because the conductive layer 11 for forming the source electrode and the drain electrode above the semiconductor layer 10 is a hydrophilic film layer, if the first photoresist layer 4 is a hydrophobic photoresist layer, the photoresist is relatively easy to be fully removed in a subsequent technological process for stripping off (also called as removing) the photoresist.

For example, as shown in FIG. 4, the distance L between the first photoresist layer located over the source electrode to be formed and the first photoresist layer located over the drain electrode to be formed is in the range of 2.0 µm to 4.5 µm, and it is equal to the gap width between the source electrode and the drain electrode in a thin film transistor formed later. When the TFT is turned on, the distance L is equal to length of a channel in an active layer. The smaller the width of the gap between a source electrode and a drain electrode of a TFT is, when the TFT is turned on, the shorter the length of the generated channel is, and the larger the turned-on current $I_{on}$ of the TFT is. This facilitates improvement of performance of the TFT.

Step S13, a second photoresist layer with a set thickness is formed at least at a region where the source electrode is to be formed and at a region where the drain electrode is to be formed on the conductive layer.

A photoresist layer with a set thickness of h is formed on the first photoresist layer. Exposure and development are conducted on the photoresist layer through a third mask, so as to retain at least the photoresist in a region corresponding to the gap between the source electrode and the drain electrode to be formed, and to remove the photoresist in other regions. It is ensured not to remove the first photoresist layer in this step.

Or, exposure and development are conducted on the photoresist layer through a third mask, so as to retain the photoresist in a region corresponding to the gate between the source electrode and the drain electrode to be formed and the photoresist directly on the first photoresist layer. Here, the retained photoresist layer is a second photoresist layer. Whether the photoresist directly on the first photoresist layer is retained or not is specifically determined depending on concrete process conditions or other factors.

Figure 5:
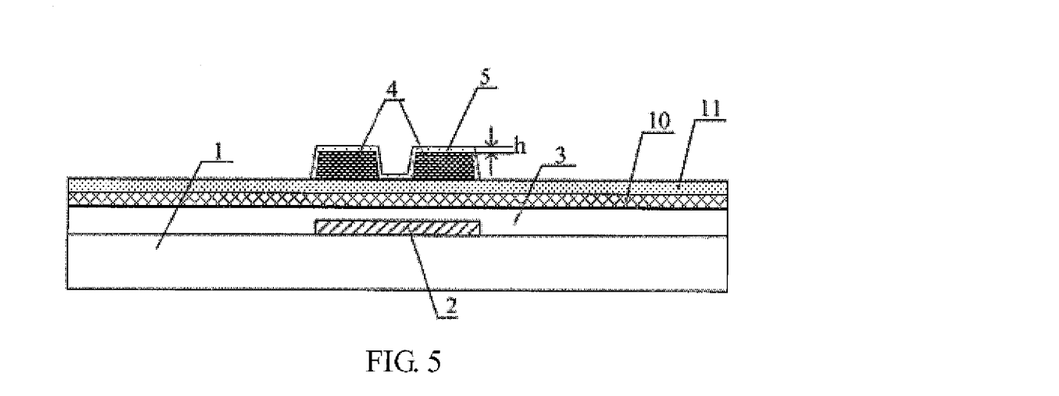
FIG. 5 is a structurally schematic view illustrating a TFT including a second photoresist layer provided by an embodiment of the invention.

As shown in FIG. 5, a second photoresist layer 5 is located on the first photoresist layer 4, and the thickness of the second photoresist layer 5 is h. Because a surface of the conductive layer 11 below the second photoresist layer 5 is flat, the thickness of the second photoresist layer 5 is uniform.

Forming the photoresist that covers the whole substrate in step S13 is conducted in a similar process to forming the photoresist that covers the whole substrate in step S12. It may be conducted by way of coating, dripping, spinning or the like, and can be determined according to actual requirements upon concrete implementation, no limit being set here.

For example, the thickness of the second photoresist layer 5 is approximately in the range of 0.3 µm to 0.8 µm (in correspondence with 3000 Å to 8000 Å).

For example, the thickness of the second photoresist layer 5 is about 0.5 µm (in correspondence with 5000 Å).

For example, the second photoresist layer is made by a hydrophobic photoresist.

For example, the material for the second photoresist layer and the material for the first photoresist layer may be same, and may also be different.

The material for the second photoresist layer, for example, meets the following conditions: the adhesion between the second photoresist layer and the first photoresist layer is larger than the adhesion between the second photoresist layer and the conductive layer for forming the source electrode and the drain electrode.

In at least one embodiment, due to the fact that the photoresist layers are each of a hydrophobic material, and the conductive layer for source and drain electrodes is of a hydrophilic material, the adhesion between the second photoresist layer and the first photoresist layer will be larger than the adhesion between the second photoresist layer and the conductive layer. The difference in adhesion between the two is helpful in performing of subsequent steps.

Step S14, an etching process is conducted on the substrate with the first photoresist layer, the second photoresist layer, the semiconductor layer and the conductive layer formed thereon, so as to form patterns of the active layer, the source electrode and the drain electrode.

Figure 6:
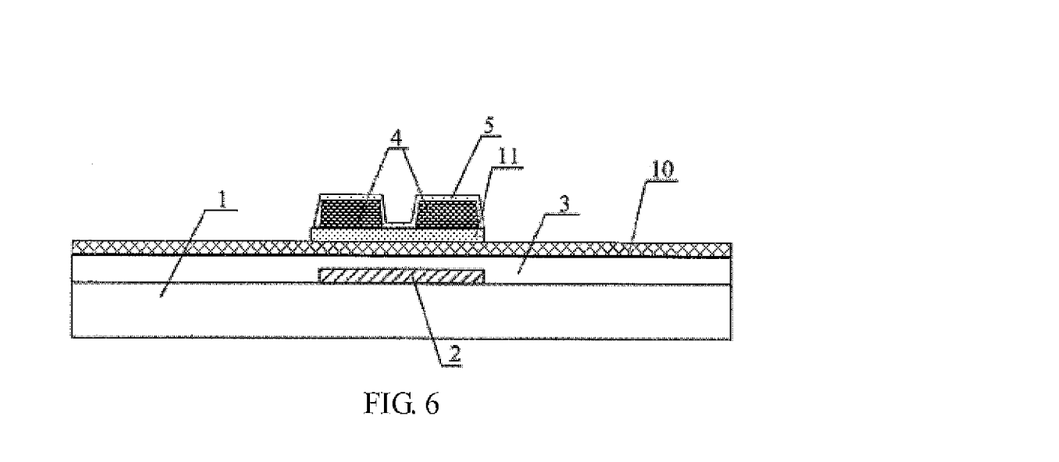
FIG. 6 is a structurally schematic view illustrating a process for forming a source electrode, a drain electrode and an active layer provided by an embodiment of the invention.

Firstly, an etching process is conducted on the conductive layer 11 to be formed into a source electrode and a drain electrode, referring to FIG. 6, so that the region covered by the first photoresist layer 4 and the second photoresist layer 5 on the conductive layer 11 is retained, and the semiconductor layer 10 in a region uncovered by the first photoresist layer 4 and the second photoresist layer 5 is exposed. For example, a wet etching is used for the etching process in the step.

Figure 7:
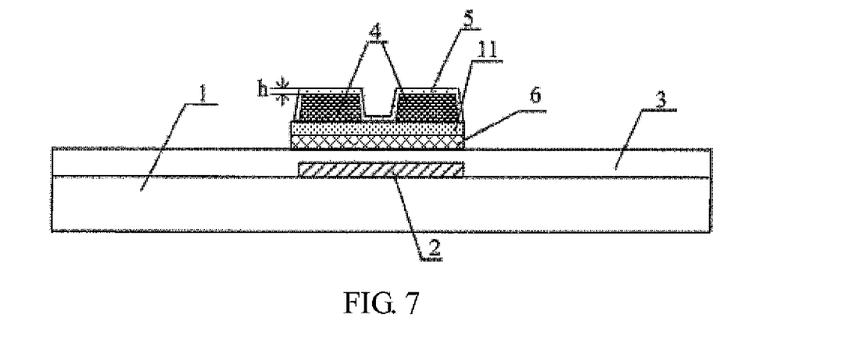
FIG. 7 is a structurally schematic view illustrating a TFT including an active layer provided by an embodiment of the invention.

Next, an etching process is conducted on the semiconductor layer 10 shown in FIG. 6, so that the semiconductor layer 10 in a region uncovered by the first photoresist layer 4 and the second photoresist layer 5 is removed, and the semiconductor layer 10 in a region covered by the first photoresist layer 4 and the second photoresist layer 5 is retained. The TFT structure to be formed is shown in FIG. 7, and the semiconductor layer in a region covered by the first photoresist layer 4 and the second photoresist layer 5 serves as the pattern of an active layer 6. For example, a dry etching is used for the etching process in the step.

Figure 8:
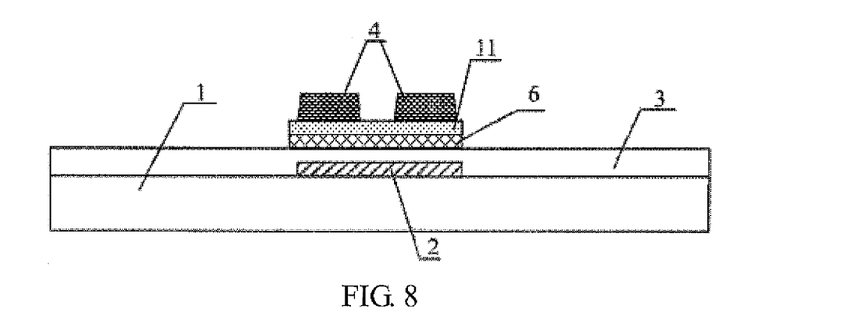
FIG. 8 is a structurally schematic view illustrating a TFT, from which a second photoresist layer is removed, provided by an embodiment of the invention.

Then, an ashing treatment is performed on the second photoresist layer 5 according to a set thickness h of the second photoresist layer 5 shown in FIG. 7, so as to fully remove the second photoresist layer 5, and to expose part of the conductive layer 11 underlying the second photoresist layer 5. That is, a gap portion between the source electrode and the drain electrode that are to be formed on the conductive layer 11 is exposed, referring to FIG. 8. In this process, due to the uniform thickness of the second photoresist layer 5, when an ashing treatment is performed on the second photoresist layer 5, the photoresist can be accurately ashed according to a thickness h of the photoresist. There is no such case where ashing of the photoresist is excessive or ashing of the photoresist is insufficient, and in turn, and an issue of GT bridge defect of a TFT or channel open defect during manufacture of the TFT does not occur.

An ashing process is a kind of dry etching. Of course, treatment on the second photoresist layer 5 is not limited to an ashing method, the second photoresist may be etched by any way capable of accurately removing the second photoresist layer without causing an excessive etching or such an etching that is not in place.

Figure 9:
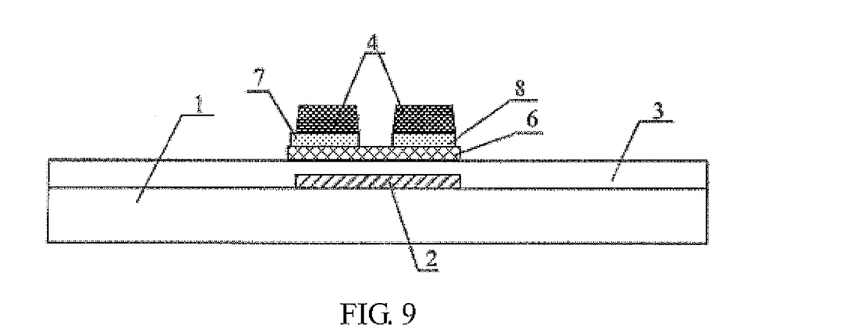
FIG. 9 is a structurally schematic view illustrating a TFT including a source electrode and a drain electrode provided by an embodiment of the invention.

Next, the conductive layer 11 is etched once again, so that a gap portion between the source electrode and the drain electrode that are to be formed on the conductive layer is removed, and patterns of a source electrode 7 and a drain electrode 8 that are insulated from each other shown in FIG. 9 are formed. For example, the etching process in the step is such as dry etching.

On the basis of step S14, the method further comprises stripping off the first photoresist layer on the source electrode and the drain electrode.

Figure 10:
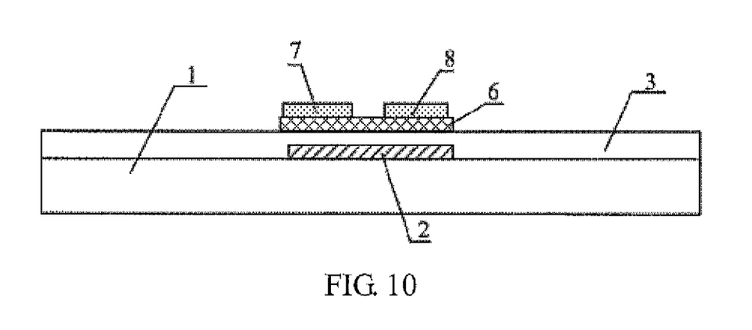
FIG. 10 is a structurally schematic view illustrating a TFT, from which, a first photoresist layer is removed, provided by an embodiment of the invention.

For example, the first photoresist layer is removed by dry etching (RP strip), referring to FIG. 10, for the TFT to be formed. Here, the TFT comprises a gate electrode 2, a gate insulating layer 3, an active layer 6, a source electrode 7 and a drain electrode 8.

The above process is a detailed process for manufacturing a bottom-gate TFT.

The process for manufacturing a top-gate TFT is similar to the above process for manufacturing a bottom-gate TFT, and the difference lies in that, patterns of an active layer, a source electrode and a drain electrode are produced formerly, and the pattern of a gate electrode and a gate insulating layer is produced later, details being omitted here.

The above process for manufacturing a TFT is brought out merely aiming at solving technical problems of the present invention, and any TFT manufacturing process containing the technical solution provided by embodiments of the invention is encompassed within the scope of the present invention. For example, in at least one embodiment of the invention, it further comprises producing an ohmic contact layer located between the active layer and the source electrode and between the active layer and the drain electrode, so as to decrease the contact resistances between the semiconductor layer and the source electrode and the drain electrode, and to enhance performance of the TFT. In at least one embodiment of the invention, as for the circumstance that the active layer is made of an amorphous silicon semiconductor layer, an amorphous silicon layer doped with a nitrogen ion may be produced between the active layer and the source electrode and the drain electrode (production of $N^+$ a-Si).

The manufacturing method of TFT provided by at least one embodiment of the invention may replace any process for achieving a photoresist layer with different thicknesses by a half-tone or gray-tone mask. It is not only adaptable for formation of a source electrode, a drain electrode and an active layer, and but also adaptable for a process of forming a photoresist of large area with different thicknesses by a half-tone or gray-tone mask.

According to at least one embodiment of the invention, there is further provided a thin film transistor, which is made by using the above manufacturing method of the thin film transistor provided by embodiments of the invention. The material type of the active layer in the thin film transistor is not limited. The structure of the thin film transistor at least comprises a gate electrode, a gate insulating layer, an active layer, a source electrode and a drain electrode, and it may further include an etch stop layer, an ohmic contact layer, a buffer layer in contact with the substrate, a passivation layer covering the whole TFT, etc. They will not be described in detail one by one.

The thin film transistor in embodiments of the invention is used for, such as, a switching element or driving element on an array substrate in a liquid crystal display panel or an organic light emitting diode (OLED) display panel. For example, in a liquid crystal panel, it acts to take control of turning-on/off of a sub-pixel unit, and in an OLED display panel, it acts to control or drive a sub-pixel unit.

Descriptions made above are merely exemplary embodiments of the invention, but are not used to limit the protection scope of the invention. The protection scope of the invention is determined by attached claims.

This application claims the benefit of priority from Chinese patent application No. 201410042408.5, filed on Jan. 28, 2014, the disclosure of which is incorporated herein in its entirety by reference as a part of the present application.

The invention claimed is:

1. A manufacturing method of a thin film transistor, comprising: forming a gate electrode pattern and a gate insulating layer on a substrate, and forming patterns of a source electrode, a drain electrode and an active layer; wherein forming patterns of the source electrode, the drain electrode and the active layer comprises:
forming a semiconductor layer and a conductive layer that cover the whole substrate on the substrate in sequence;
forming a first photoresist layer at a region where the source electrode is to be formed and at a region where the drain electrode is to be formed on the conductive layer, respectively;
forming a second photoresist layer on the first photoresist layer at least at a gap between the source electrode and the drain electrode that are to be formed on the conductive layer, wherein the second photoresist layer is a film layer with a uniform thickness; and
conducting an etching process on the substrate with the first photoresist layer, the second photoresist layer, the semiconductor layer and the conductive layer formed thereon, so as to form patterns of the active layer, the source electrode and the drain electrode, wherein the second photoresist layer is etched according to the uniform thickness of the second photoresist.

2. The method claimed as claim 1, wherein forming patterns of the active layer, the source electrode and the drain electrode further comprises:
conducting an etching process on the conductive layer, so as to retain the conductive layer in a region covered by the first photoresist layer and the second photoresist layer, and to expose the semiconductor layer in a region uncovered by the first photoresist layer and the second photoresist layer;
conducting an etching process on the semiconductor layer, so as to remove the semiconductor layer in the region uncovered by the first photoresist layer and the second photoresist layer, with the semiconductor layer in a region covered by the first photoresist layer and the second photoresist layer serving as an active layer pattern;
performing an ashing treatment on the second photoresist layer according to the thickness of the second photoresist, so as to expose the conductive layer in correspondence with a gap between the source electrode and the drain electrode that are to be formed;
conducting an etching process on the conductive layer once again, so as to remove the conductive layer in correspondence with the gap between the source electrode and the drain electrode that are to be formed, and to form patterns of the source electrode and the drain electrode that are insulated from each other.

3. The method claimed as claim 2, after forming patterns of the active layer, the source electrode and the drain electrode, further comprising stripping off the first photoresist layer on the source electrode and the drain electrode.

4. The method claimed as claim 1, wherein the process of forming the gate electrode pattern and the gate insulating layer on the substrate comprises:
before patterns of the source electrode, the drain electrode and the active layer is formed, forming the gate electrode pattern on the substrate and the gate insulating layer located on the gate electrode pattern; or
after patterns of the source electrode, the drain electrode and the active layer is formed, forming the gate insulating layer on the substrate and the gate electrode pattern located over the gate insulating layer.

5. The method claimed as claim 1, wherein a thickness of the first photoresist layer is in the range of 1.5 μm to 2.5 μm.

6. The method claimed as claim 1, wherein a thickness of the second photoresist layer is in the range of 0.3 μm to 0.8 μm.

7. The method claimed as claim 1, wherein the distance between the source electrode and the drain electrode that are to be formed is in a range of 2.5 μm to 4.55 μm.

8. The method claimed as claim 1, wherein the active layer is made of amorphous silicon, polycrystalline silicon or a metal oxide semiconductor.

9. The method claimed as claim 2, wherein the process of forming the gate electrode pattern and the gate insulating layer on the substrate comprises:
before patterns of the source electrode, the drain electrode and the active layer is formed, forming the gate electrode pattern on the substrate and the gate insulating layer located on the gate electrode pattern; or
after patterns of the source electrode, the drain electrode and the active layer is formed, forming the gate insulating layer on the substrate and the gate electrode pattern located over the gate insulating layer.

10. The method claimed as claim 2, wherein a thickness of the first photoresist layer is in the range of 1.5 μm to 2.5 μm.

11. The method claimed as claim 2, wherein the second photoresist layer is a film layer with a uniform thickness; and a thickness of the second photoresist layer is in the range of 0.3 μm to 0.8 μm.

12. The method claimed as claim 2, wherein the distance between the source electrode and the drain electrode that are to be formed is in a range of 2.5 μm to 4.55 μm.

13. The method claimed as claim 2, wherein the active layer is made of amorphous silicon, polycrystalline silicon or a metal oxide semiconductor.

14. The method claimed as claim 3, wherein the process of forming the gate electrode pattern and the gate insulating layer on the substrate comprises:
before patterns of the source electrode, the drain electrode and the active layer is formed, forming the gate electrode pattern on the substrate and the gate insulating layer located on the gate electrode pattern; or
after patterns of the source electrode, the drain electrode and the active layer is formed, forming the gate insulating layer on the substrate and the gate electrode pattern located over the gate insulating layer.

15. The method claimed as claim 3, wherein a thickness of the first photoresist layer is in the range of 1.5 μm to 2.5 μm.

16. The method claimed as claim 3, wherein the second photoresist layer is a film layer with a uniform thickness; and a thickness of the second photoresist layer is in the range of 0.3 μm to 0.8 μm.

17. The method claimed as claim 3, wherein the distance between the source electrode and the drain electrode that are to be formed is in a range of 2.5 μm to 4.55 μm.

18. The method claimed as claim 3, wherein the active layer is made of amorphous silicon, polycrystalline silicon or a metal oxide semiconductor.

19. A manufacturing method of a thin film transistor, comprising:

forming a gate electrode pattern and a gate insulating layer on a substrate, and forming patterns of a source electrode, a drain electrode and an active layer;

wherein forming patterns of the source electrode, the drain electrode and the active layer comprises:

forming a semiconductor layer and a conductive layer that cover the whole substrate on the substrate in sequence;

forming a first photoresist layer at a region where the source electrode is to be formed and at a region where the drain electrode is to be formed on the conductive layer, respectively;

forming a second photoresist layer at least at a gap between the source electrode and the drain electrode that are to be formed on the conductive layer, wherein the second photoresist layer is a film layer with a uniform thickness;

conducting an etching process on the substrate with the first photoresist layer, the second photoresist layer, the semiconductor layer and the conductive layer formed thereon, so as to form patterns of the active layer, the source electrode and the drain electrode, wherein the second photoresist layer is etched according to the uniform thickness of the second photoresist;

conducting an etching process on the conductive layer, so as to retain the conductive layer in a region covered by the first photoresist layer and the second photoresist layer, and to expose the semiconductor layer in a region uncovered by the first photoresist layer and the second photoresist layer;

conducting an etching process on the semiconductor layer, so as to remove the semiconductor layer in the region uncovered by the first photoresist layer and the second photoresist layer, with the semiconductor layer in a region covered by the first photoresist layer and the second photoresist layer serving as an active layer pattern;

performing an ashing treatment on the second photoresist layer according to the thickness of the second photoresist, so as to expose the conductive layer in correspondence with a gap between the source electrode and the drain electrode that are to be formed;

conducting an etching process on the conductive layer once again, so as to remove the conductive layer in correspondence with the gap between the source electrode and the drain electrode that are to be formed, and to form patterns of the source electrode and the drain electrode that are insulated from each other;

wherein after forming patterns of the active layer, the source electrode and the drain electrode, further comprising stripping off the first photoresist layer on the source electrode and the drain electrode.

* * * * *